(12) United States Patent
Yu et al.

(10) Patent No.: US 8,602,372 B2
(45) Date of Patent: Dec. 10, 2013

(54) RETAINING STRUCTURE

(75) Inventors: Mo-Ming Yu, Shenzhen (CN);
Wen-Feng Hu, Shenzhen (CN)

(73) Assignees: Hong Fu Jin Precision Industry (ShenZhen) Co., Ltd., Shenzhen (CN);
Hon Hai Precision Industry Co., Ltd., New Taipei (TW)

( * ) Notice: Subject to any disclaimer, the term of this patent is extended or adjusted under 35 U.S.C. 154(b) by 273 days.

(21) Appl. No.: 13/274,589

(22) Filed: Oct. 17, 2011

(65) Prior Publication Data
US 2013/0020452 A1      Jan. 24, 2013

(30) Foreign Application Priority Data

Jul. 20, 2011 (CN) .......................... 2011 1 0203599

(51) Int. Cl.
| A47B 96/00 | (2006.01) |
|---|---|
| A47K 1/00 | (2006.01) |
| A47K 5/00 | (2006.01) |

(52) U.S. Cl.
USPC .............. 248/224.8; 248/223.41; 248/222.41; 248/235; 248/241; 211/192

(58) Field of Classification Search
USPC ............ 248/224.8, 223.41, 222.41, 235, 241; 312/334.4, 333, 330.1; 211/192, 26
See application file for complete search history.

(56) References Cited

U.S. PATENT DOCUMENTS

| 5,025,937 | A  | * | 6/1991 | King ............................. 211/192 |
|---|---|---|---|---|
| 6,773,080 | B2 | * | 8/2004 | Chen et al. ................. 312/265.1 |
| 7,703,734 | B2 | * | 4/2010 | Chen et al. ................. 248/298.1 |
| 2005/0156493 | A1 | * | 7/2005 | Yang et al. ................. 312/334.5 |
| 2008/0067907 | A1 | * | 3/2008 | Chen et al. ..................... 312/312 |
| 2011/0192946 | A1 | * | 8/2011 | Yu et al. ................... 248/222.11 |

* cited by examiner

*Primary Examiner* — Amy J. Sterling
(74) *Attorney, Agent, or Firm* — Altis Law Group, Inc.

(57) ABSTRACT

A retaining structure includes a bracket, a retaining element, a securing element, a spring and a latching element. The bracket defines a mounting hole. The retaining element defines an opening and having a pin. The securing element is slidably retained to the retaining element. The securing element defines a securing groove, a guiding groove and a sliding groove. The sliding groove has a first end and a second end. The spring connects the retaining element and the securing element. The latching element is latched with the securing element. The latching element including a latching board and a latching post protruding from the latching board.

9 Claims, 6 Drawing Sheets

RETAINING STRUCTURE

BACKGROUND

1. Technical Field

This disclosure relates to retaining structures, particularly to a retaining structure used in servers.

2. Description of Related Art

A typical sliding mechanism of a server generally includes an inner rail, a middle rail, and an outer rail. The inner rail is mounted on the server, the outer rail is mounted to a support frame of the server, and the middle rail is mounted between the inner rail and the outer rail to extend the sliding distance of the sliding mechanism. However, in the conventional product configurations, the sliding mechanism is typically fixed to the server by some screws. Thus, it is difficult to fix or detach the sliding mechanism to or from the server without a tool, such as a screwdriver.

Therefore, there is a room for improvement in the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the exemplary retaining structure for server. Moreover, in the drawings like reference numerals designate corresponding parts throughout the several views. Wherever possible, the same reference numbers are used throughout the drawings to refer to the same or like elements of an embodiment.

DETAILED DESCRIPTION

Figure 1:
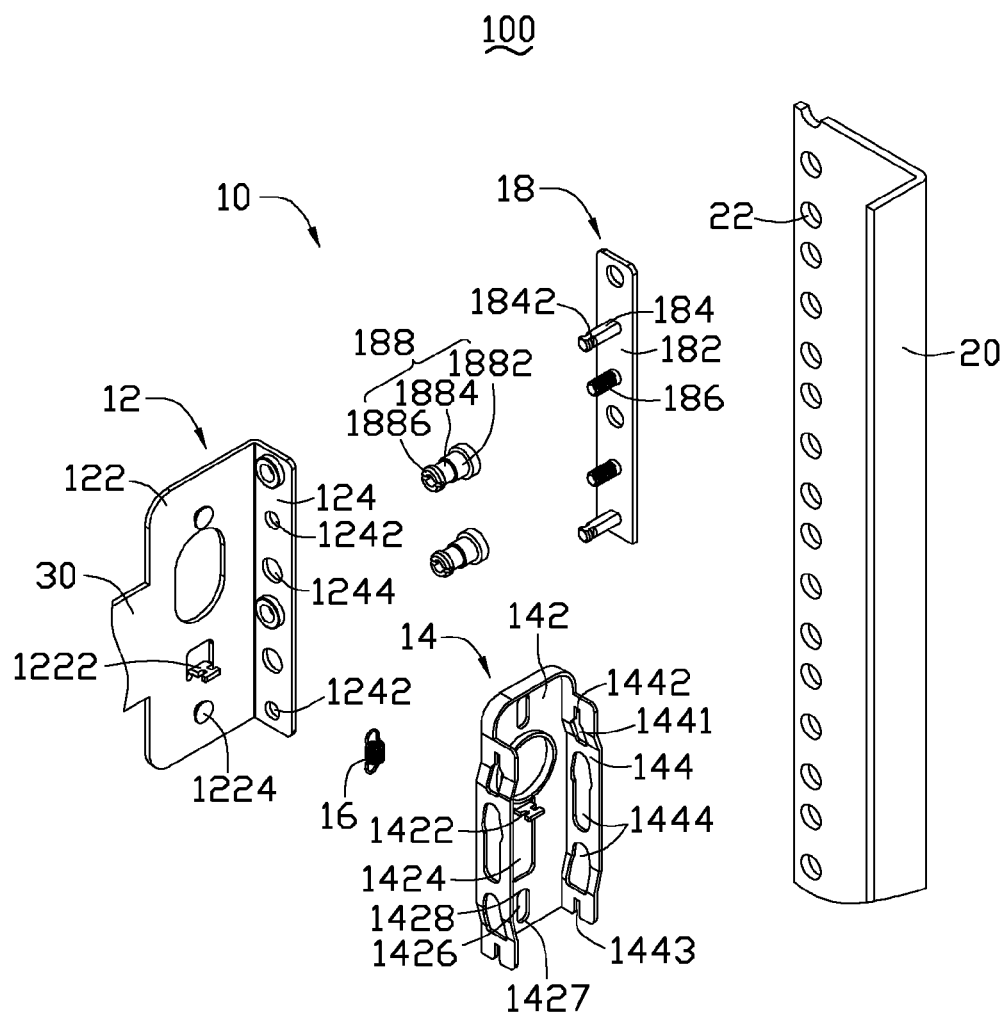
FIG. 1 is an exploded view of a server with a retaining structure according to an exemplary embodiment.
Figure 2:
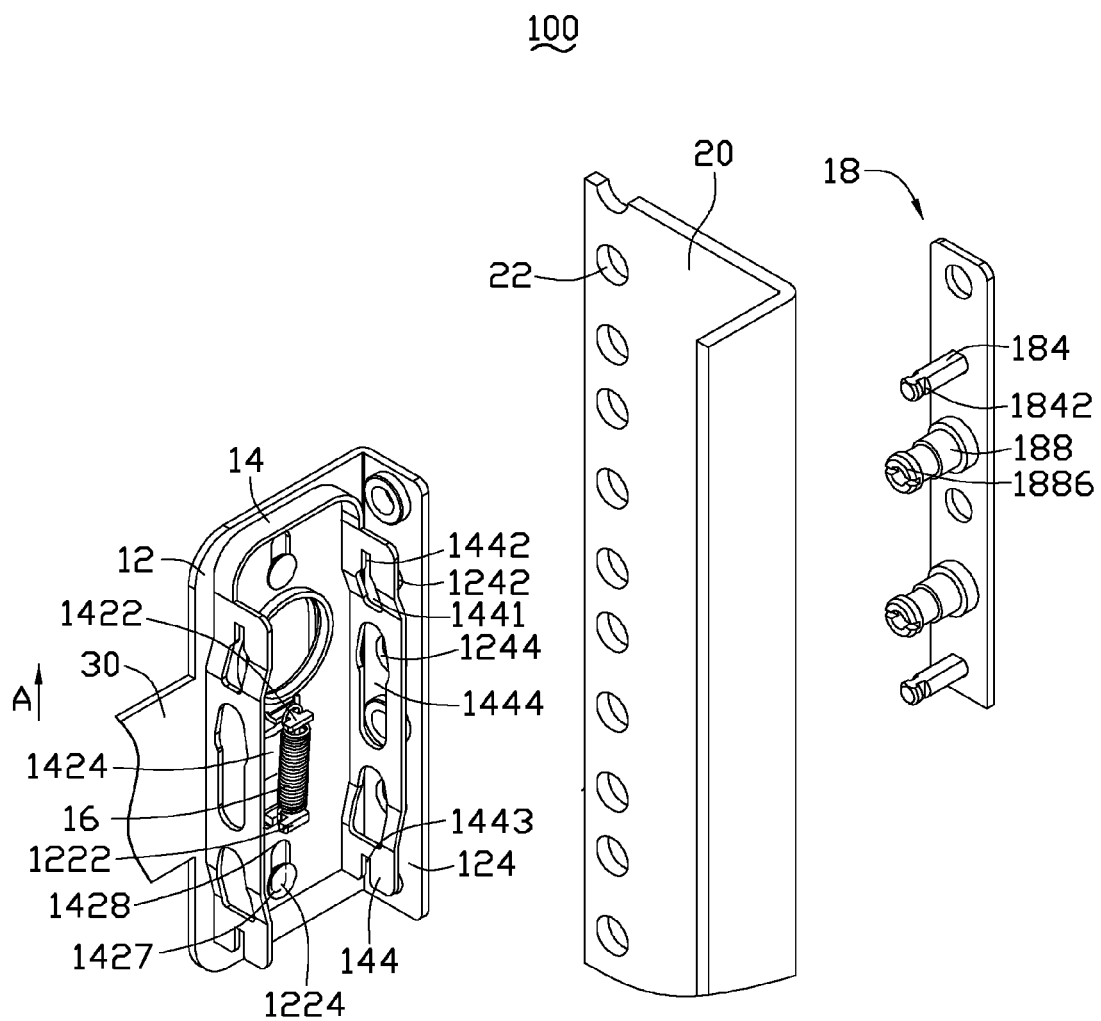
FIG. 2 is partially assembled and enlarged view of the server in FIG. 1.
Figure 3:
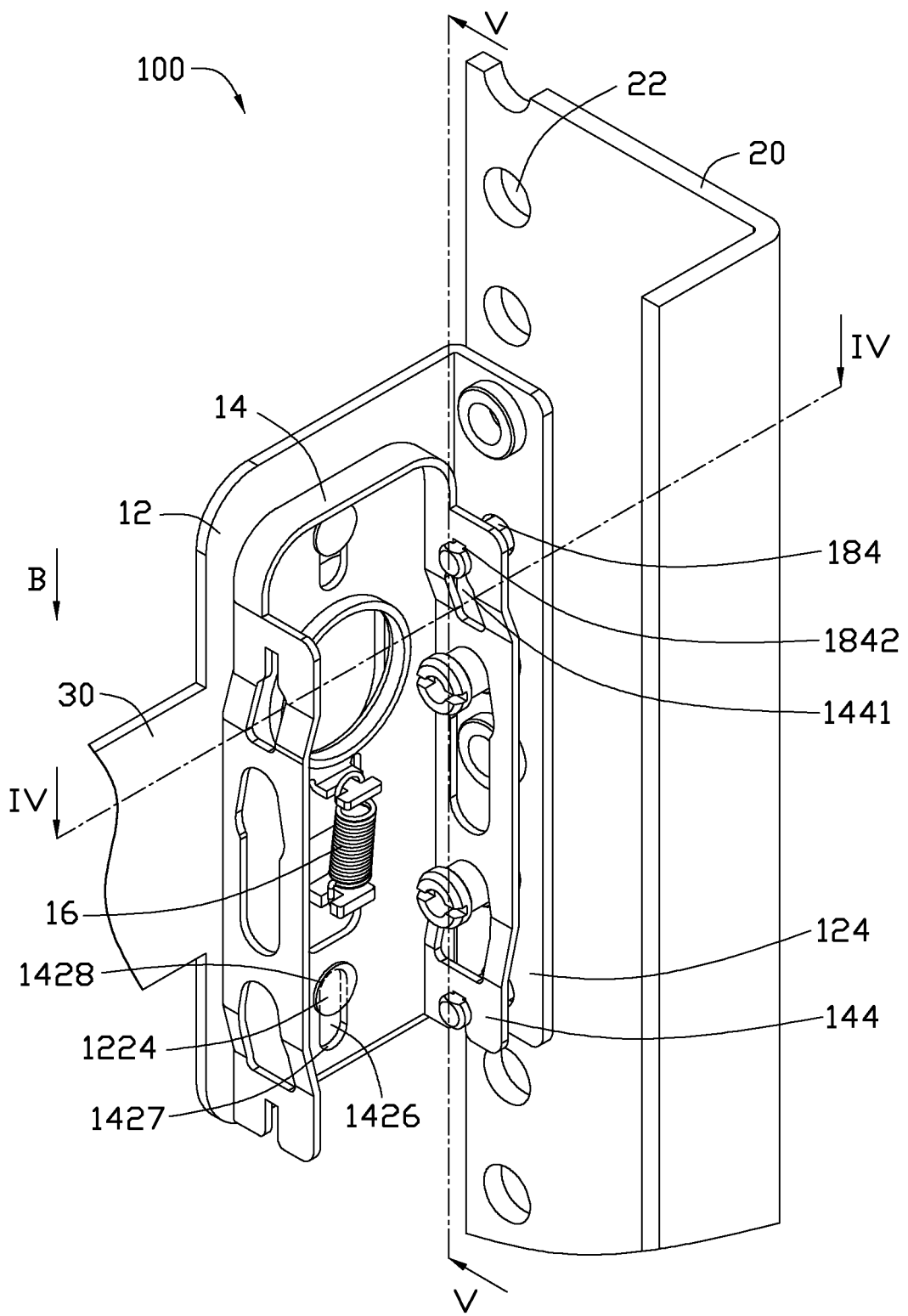
FIG. 3 is an enlarged and assembled view of the server of in FIG. 2.
Figure 4:
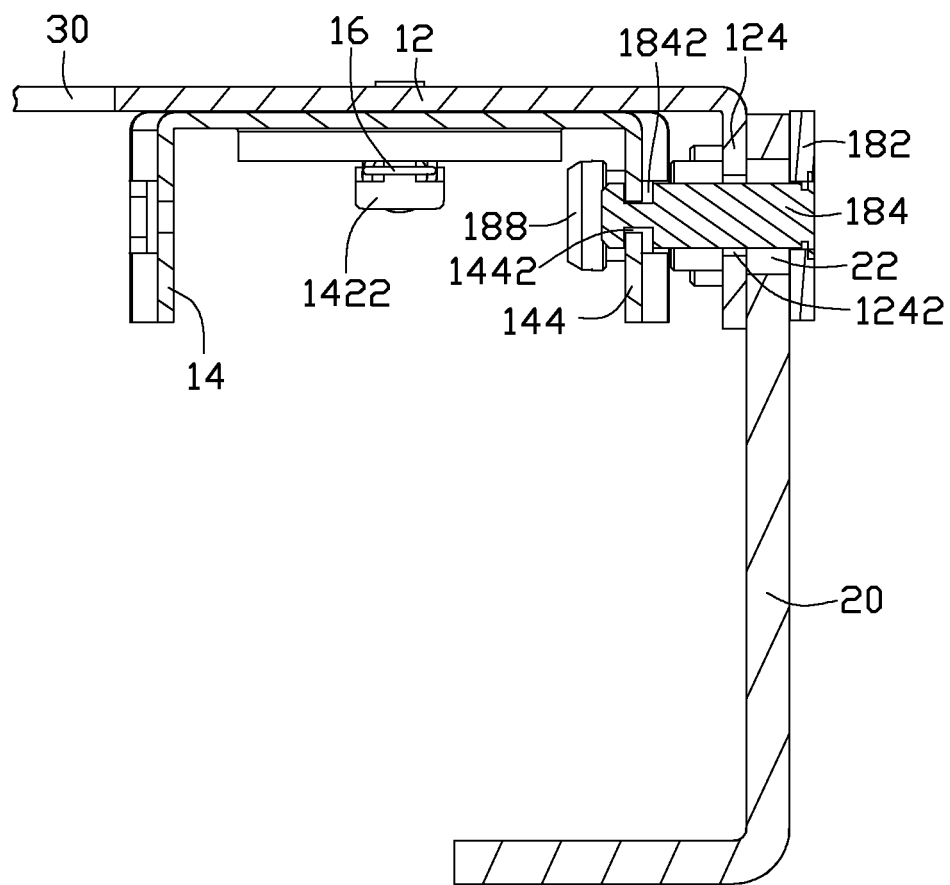
FIG. 4 is a cross sectional view of the server in FIG. 3 along a line of IV-IV.
Figure 5:
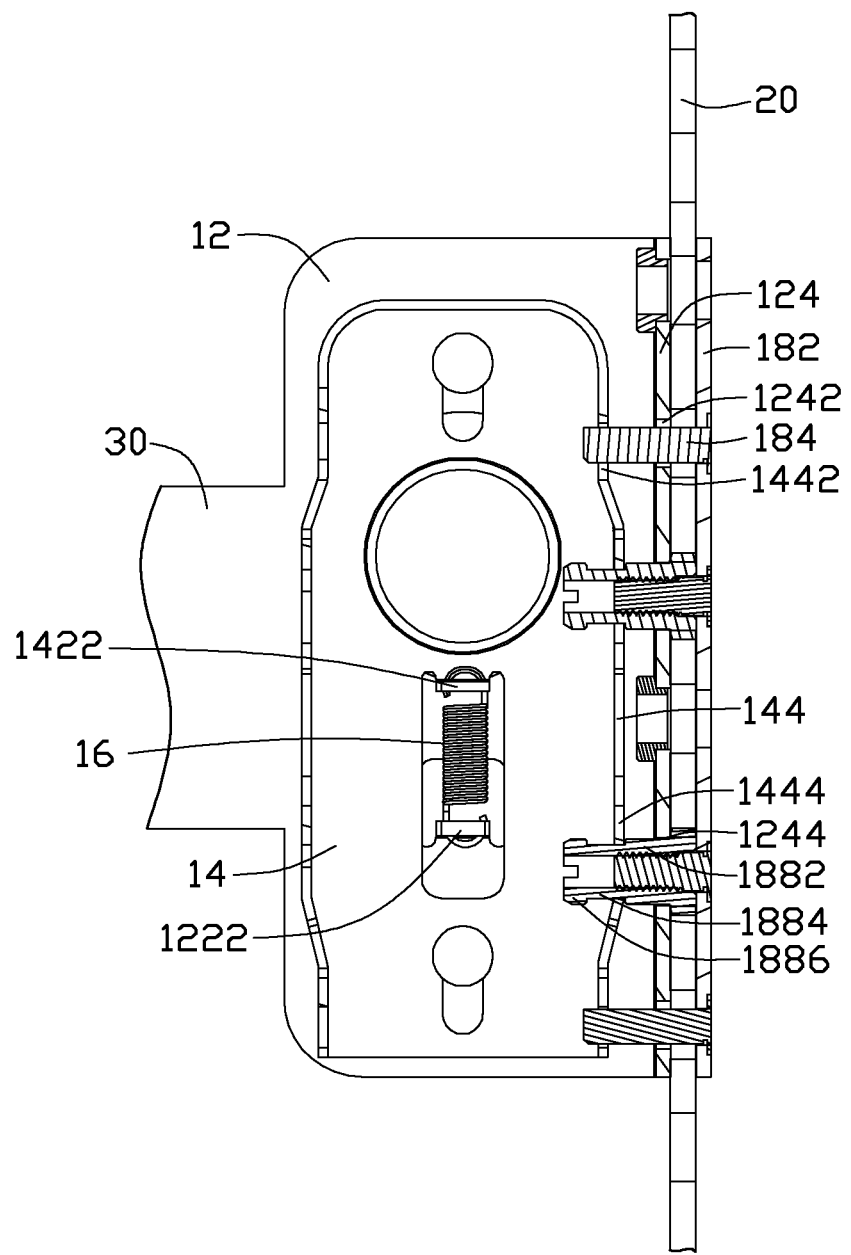
FIG. 5 is a cross sectional view of the server in FIG. 3 along a line of V-V.

Referring to FIG. 1, an exemplary embodiment of a server 100 includes a bracket 20, a sliding rail 30 and a retaining structure 10. The retaining structure 10 retains the sliding rail 30 to the bracket 20.

The retaining structure 10 includes a retaining element 12, a securing element 14 slidably retained to the retaining element 12, a spring 16 connecting the retaining element 12 with the securing element 14 and a latching element 18 latching with the securing element 14. In this exemplary embodiment, the retaining element 12 is a portion of the sliding rail 30. In another exemplary embodiment, the retaining element 12 may be a separated element, and then retained to the sliding rail 30.

The retaining element 12 includes a retaining board 122 and a resisting board 124 bending from the retaining board 122. In this exemplary embodiment, the retaining board 122 is perpendicularly connected to the resisting board 124. The retaining board 122 protrudes a first retaining portion 1222 for retaining one end of the spring 16, and two pins 1224 for guiding the securing element 14 to slide relative to the retaining element 12. The resisting board 124 defines two first openings 1242 and two second openings 1244 located between the first openings 1242. The first openings 1242 and the second openings 1244 are for the latching element 18 passing through the retaining element 12, and the detail will be described below.

The securing element 14 includes a sliding board 142 and a securing board 144 protruding from an edge of the sliding board 142. The sliding board 142 protrudes a second retaining portion 1422 for retaining the other end of the spring 16. The sliding board 142 further defines a passage for the first retaining portion 1222 passing through the sliding board 142, and two sliding holes 1426 respectively located two sides of the passage 1424. Each sliding hole 1426 includes a first end 1427 and a second end 1428. Each pin is slidably retained to one of the sliding holes 1426 so the securing element 14 can slide relative to the retaining element 12 along the pins 1224. When the securing element 14 slides relative to the retaining element 12, the first retaining portion 1222 slides in the passage 1424.

The securing board 144 defines two first securing grooves 1442, 1443 and two second securing grooves 144 located between the first securing grooves 1442, 1443. The first securing grooves 1142, 1443 and the second securing grooves 144 are for latching with the latching element 18. In this exemplary embodiment, the securing board 144 may further define a guiding groove 1441 communicating with the first securing groove 1442, and the guiding groove 1441 is larger than the first securing groove 1442 for guiding the latching element 18 to be latched in the first securing groove 1442. The first securing groove 1443 extends to a distal end of the securing board 144 to facilitate the latching element 18 being latched in the other first securing groove. It is to be understood that the securing board 144 may further defines another guiding groove 1441 communicating with the first securing groove 1443 for guiding the latching element 18 to be latched in the first securing groove 1443 if the first securing groove 1443 does not extend to the distal end of the securing board 144.

The latching element 18 includes a latching board 182, two first latching posts 184 respectively located near two ends of the latching board 182, two retaining posts 186 located between the first latching posts 184 and two second latching posts 188 respectively fixed to the retaining posts 186. Each first latching post 184 defines a latching groove 1842 near its distal end. Portions of the securing board 144 surrounding the securing grooves are latched in the latching grooves 1842 so the latching board 182 is secured to the securing board 144. Each second latching post 188 is screwed to one of the retaining posts 186. Each second latching post 188 includes a resisting portion 1882, a connecting portion 1884 protruding from the resisting portion 1882 and a latching block 1886 protruding from the connecting portion 1884. The resisting portion 1882 and the latching block 1886 are both larger than the connecting portion 1884.

The bracket 20 defines a plurality of mounting holes 22. The mounting holes 22 are for the first latching posts 184, the retaining posts 186 and the second latching posts 188 passing through the bracket 20.

Referring to FIGS. 2 to 5, in assembly, each pin 1224 is slidably retained in one of the sliding holes 1426 with the first retaining portion 1222 passing through the passage 1424 so the securing element 14 is slidably retained to the retaining element 12. One end of the spring 16 is retained to the first retaining portion 1222, and the other end of the spring 16 is retained to the second retaining portion 1422. The securing board 144 is driven to slide relative to the retaining board 122 in a first direction A (FIG. 2) until each pin 1224 slides from corresponding first end 1427 to corresponding second end 1428. At this time, the guiding groove 1441 is aligned with one of the first openings 1242 with the spring 16 is expanded to accumulate elastic force. One of the first latching posts 184 passes through corresponding mounting hole 22, corresponding first opening 1242 and the guiding groove 1441, the other first latching post 184 passes through corresponding mounting hole 22, and corresponding first opening 1242 until its latching groove 1842 is aligned with the first securing groove 1443. Each second latching post 188 passes through corresponding mounting hole 22, second opening 1244 and second securing groove 1444. The securing element 14 is released so the spring 16 provides elastic force to make the securing element 14 slide relative to the retaining element 12 in a second direction B (FIG. 3) opposite to the first direction A until each pin 1224 slides from corresponding second end to corresponding first end. At this time, the portions of the securing board 144 surrounding the first securing grooves 1442 are latched in the latching grooves 1842, and the portions of the first latching posts 184 surrounding by the latching grooves 1842 are latched in the first securing grooves 1442, and the second latching posts 188 are latched in the second securing grooves 144.

Figure 6:
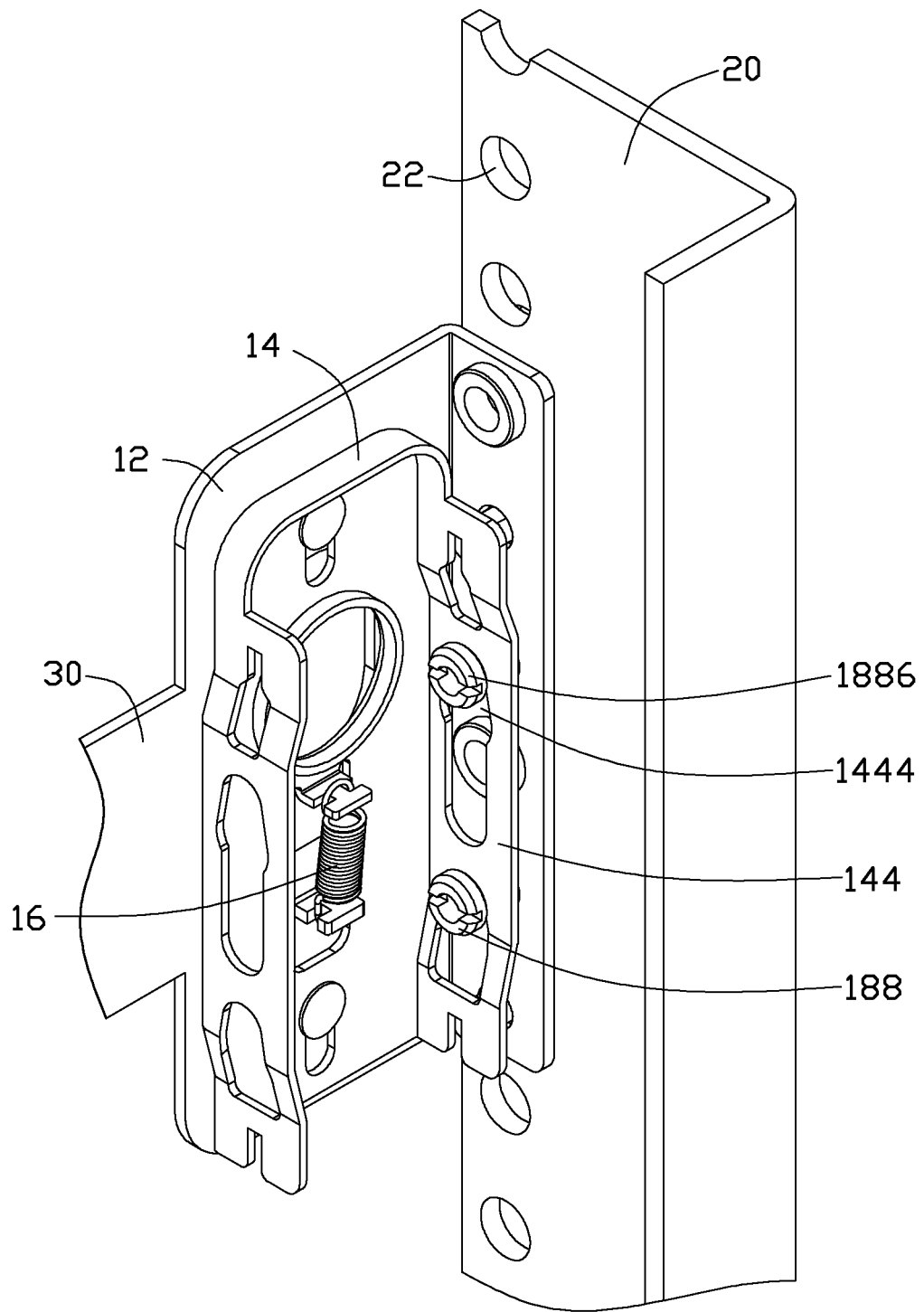
FIG. 6 is another assembled view of the server of in FIG. 1.

Referring to FIG. 6, the retaining element 12 may be retained to the bracket 20 only by the latching engagement of the second latching posts 188 and the second securing grooves 144 if the first latching posts 184 are not long enough to extend into the first securing grooves 1142, 1443.

It is to be further understood that even though numerous characteristics and advantages of the exemplary embodiments have been set forth in the foregoing description, together with details of structures and functions of various embodiments, the disclosure is illustrative only, and changes may be made in detail, especially in matters of shape, size, and arrangement of parts within the principles of the exemplary invention to the full extent indicated by the broad general meaning of the terms in which the appended claims are expressed.

What is claimed is:

1. A retaining structure, comprising:
    a bracket defining a mounting hole;
    a retaining element defining an opening;
    a securing element slidably retained to the retaining element, the securing element defining a securing groove;
    a spring connecting the retaining element with the securing element;
    a latching element latched with the securing element, the latching element including a latching board and a latching post protruding from the latching board;
    wherein after the latching post passes through the mounting hole, the opening, the latching groove in turn, the spring provide elastic force to make the latching post be latched in the latching groove so the retaining element is retained to the bracket.

2. The retaining structure as claimed in claim 1, wherein the retaining element protrudes a pin; the securing board defines a sliding groove, in which the pin is slidably retained.

3. The retaining structure as claimed in claim 1, wherein the retaining element protrudes a first retaining portion; the securing element protrudes a second retaining portion and defines a passage; one end of the spring is retained to the first retaining portion, the other end of the spring is retained to the second retaining portion; the first retaining portion passes through and is slidably retained in the passage.

4. The retaining structure as claimed in claim 1, wherein the latching post defines a latching groove, a portion of the securing board surrounding the securing groove is latched in the latching groove, and a portion of the latching post surrounding by the latching groove is latched in the securing groove so the latching element is latched to the securing element.

5. The retaining structure as claimed in claim 1, wherein the securing board further defines a guiding groove communicating with the securing groove, the guiding groove is larger than the first securing groove for guiding the latching element to be latched in the securing groove.

6. The retaining structure as claimed in claim 5, wherein the securing groove comprises a first end and a second end; when the pin is located at the second end, the guiding groove is aligned with the opening with the spring is expanded to accumulate elastic force; when the pin slides from the second end to the first end, the securing groove is aligned with the opening so the latching post is latched in the securing groove.

7. A retaining structure, comprising:
    a bracket defining a mounting hole;
    a retaining element defining an opening and having a pin;
    a securing element slidably retained to the retaining element, the securing element defining a securing groove, a guiding groove and a sliding groove, the guiding groove communicating with the securing groove, the sliding groove having a first end and a second end;
    a spring connecting the retaining element with the securing element;
    a latching element latched with the securing element, the latching element including a latching board and a latching post protruding from the latching board;
    wherein the pin is slidably retained in the sliding groove; when the pin is located in the second end, the guiding groove is aligned with the mounting hole and the opening for the latching post passing through the mounting hole, the opening, the guiding groove in turn, and the spring is expanded to accumulate elastic force;
    the accumulated elastic force of the spring drives the latching post to be latched in the latching groove with the pin sliding from the second end to the first end.

8. The retaining structure as claimed in claim 7, wherein the retaining element protrudes a first retaining portion; the securing element protrudes a second retaining portion and defines a passage; one end of the spring is retained to the first retaining portion, the other end of the spring is retained to the second retaining portion; the first retaining portion passes through and is slidably retained in the passage.

9. The retaining structure as claimed in claim 7, wherein the latching post defines a latching groove, a portion of the securing board surrounding the securing groove is latched in the latching groove, and a portion of the latching post surrounding by the latching groove is latched in the securing groove so the latching element is latched to the securing element.

* * * * *